United States Patent [19]

Ihara

[11] 4,048,582
[45] Sept. 13, 1977

[54] PHASE LOCKED LOOP SYNTHESIZER
[75] Inventor: Takashi Ihara, Yokohama, Japan
[73] Assignee: Hitachi, Ltd., Japan
[21] Appl. No.: 736,580
[22] Filed: Oct. 28, 1976
[30] Foreign Application Priority Data Oct. 31, 1975 Japan .............................. 50-130328

[51] Int. Cl.² ............................................. H03B 3/04
[52] U.S. Cl. ..................................... 331/16; 325/421;
325/422; 331/22; 331/36 C
[58] Field of Search ............... 325/421, 422; 331/1 A,
331/16, 18, 22, 36 C

[56] References Cited
U.S. PATENT DOCUMENTS

| | | | |
|---|---|---|---|
| 3,440,544 | 4/1969 | Pampel | 331/36 C |
| 3,495,195 | 2/1970 | Ribour | 331/1 A |
| 3,845,393 | 10/1974 | Basset | 331/1 A |

*Primary Examiner*—John Kominski
*Attorney, Agent, or Firm*—Craig & Antonelli

[57] ABSTRACT

A phase locked loop synthesizer comprising a means for controlling a tuning means, wherein a phase difference between the outputs of a reference signal oscillator and a programmable counter means is detected by a phase detector to obtain a d.c. voltage corresponding to the phase difference, an output having a prescribed frequency is generated by a voltage controlled oscillator frequency is controlled by said d.c. voltage, a part of said output and the output having a second reference frequency from a local oscillator are mixed by a mixer, the mixed output is supplied to a tuning means which is tuned to the mixed difference frequency, the output of said tuned means is supplied to said counter means to be frequency divided in a prescribed division ratio and sent to said phase detector, a part of digital input data for setting the frequency division ratio of said counter means is detected, and in accordance with the input data the tuning reactance of said tuning means is varied thereby to control the tuned frequency of said tuning means.

12 Claims, 5 Drawing Figures

PHASE LOCKED LOOP SYNTHESIZER

BACKGROUND OF THE INVENTION

1. FIELD OF THE INVENTION

This invention relates to a phase locked loop (hereinafter referred to as PLL) synthesizer.

2. DESCRIPTION OF THE PRIOR ART

Figure 1:
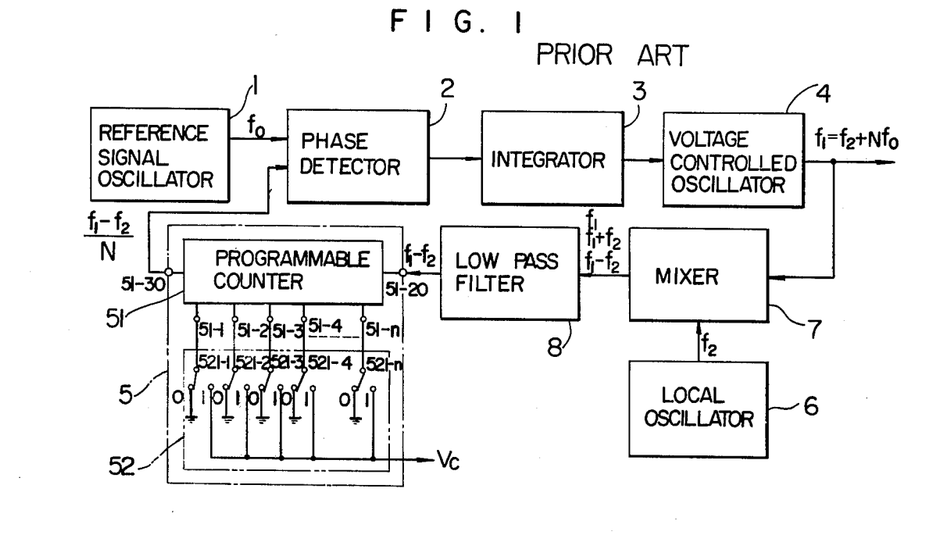
FIG. 1 is a block diagram showing a prior art PLL synthesizer.

FIG. 1 is a block diagram showing the construction of a PLL synthesizer as most commonly used.

In FIG. 1, 1 denotes a reference signal oscillator which employs usually a crystal vibrator and supplys a stable reference frequency $f_0$. 2 denotes a phase detector which compares the phases of the signal with a frequency $f_0$ from the signal oscillator 1 and an output with a frequency $(f_1 - f_2)/N$ from a below-mentioned programmable counter and detects the phase difference. A d.c. voltage is generated corresponding to this phase difference. 3 denotes an integrator which integrates and smooths the output voltage of the phase detector 2. A continuous voltage component proportional to the phase difference is picked up and fed to the input terminal of a voltage controlled oscillator 4 of the next stage. The oscillation frequency $f_1$ of the voltage controlled oscillator 4 is controlled to higher and lower values in proportion to an increase and a decrease of the controlled d.c. voltage applied to its input terminal respectively. 6 is a local oscillator. 7 is a mixer which mixes the output frequency $f_1$ of the voltage controlled oscillator 4 and the output frequency $f_2$ of the local oscillator 6 to obtain the frequencies $f, f_1 + f_2$ and $f_1 - f_2$. In the prior art construction of this kind, a low pass filter 8 is employed in order to pass only the difference frequency $f_1 - f_2$ of the mixer signals 7 to the input terminal 51 - 20 of the programmable counter 51, which is operated with the input with the frequency $f_1 - f_2$. 5 denotes a programmable counter means consisting of a programmable counter 51 and a means for setting the frequency division ratio N. By switching the switch group 521-1, 521-2 ... 521-n ($n$ is an integer with $n \geq 2$) and supplying "0" or "1" digital input data to the input terminals 51-1, 51-2, 51-3, 51-4, ... 51-n respectively, the counter means 5 can set the frequency division ratio to an arbitrary integer value within a certain range. If we assume that the figures of the input data terminals 51-1, 51-2, 51-3, 51-4, ... 51-n increase in this order, the frequency division ratio N increases or decreases by 1 by switching the input data to the terminal 51-1 from "0" to "1" or from 1 to 0 respectively. The ratio N increases or decreases by 2 if the input data to the terminal 51-2 is changed from 0 to 1 or from 1 to 0 respectively. The ratio N increases or decreases by 4 if the input data to the terminal 51-3 is switched from 0 to 1 or from 1 to 0 respectively. It is so weighted that the ratio N increases or decreases by $2^{n-1}$ if the input data to the terminal 51-n is switched from 0 to 1. The output of the counter 51 having a frequency of $(f_1 - f_2)/N$ is supplied to the phase detector. The system so operates as to cancel the phase difference and determine the output of the voltage controlled oscillator. Since the art is well known, detailed explanation of it will be omitted. For example, USP at. no. 3,845,394 may be referred to.

The prior art PLL synthesizer as shown in FIG. 1 has a defect that the difference frequency of the mixer 7 or the operating frequency of the programmable counter 51 can not be pulled up to the maximum operating frequency. In another word, it is difficult that the counter 51 operates at its maximum frequency. The reason is as follows. Although the programmable counter 51 is designed to be operable with an input having a maximum frequency of about 15 MHz, when such an input comes into the counter 51 by way of a conventional low pass filter 8, it is by-passed to the earth through stray capacitance. The amount of signal by-passed increases with frequency and causes a large attenuation of the input to the counter 51. No amplitude large enough to operate the counter 51 (at least IV) can be obtained. Hence, generally the maximum operating frequency of the counter is set at 10MHz for the TTL (transistor transistor logic). In a usual circuit construction, the operating frequency below which an amplitude enough to operate the counter 51 is obtained is set at 7 or 8 MHz.

Therefore, when the output frequency of the voltage controlled oscillator 4 increases, and hence the difference frequency $f_1 - f_2$ of the output of the mixer 7 or the operation frequency of the counter 51 increases above e.g. 10 MHz, the counter 51 stops its operation. In such a case, a complicated countermeasure should be necessary, i.e., either the oscillation frequency of the local oscillator 6 should be switched down so that the mixed difference between the frequencies of the voltage controlled oscillator 4 and the local oscillator 6 becomes less than 10 MHz, i.e., to about 7 or 8 MHz, or a frequency multiplier should be provided after the voltage controlled oscillator 4 so that the mixed difference frequency of the mixer 7 is so controlled as described above.

SUMMARY OF THE INVENTION

An object of the present invention is to provide a PLL synthesizer capable of pulling up the difference frequency of the mixer or the programmable counter to the maximum operation frequency.

Another object of this invention is to provide a PLL synthesizer capable of giving a stable and sufficiently large amplitude to the difference frequency or the operation frequency of the programmable counter.

A further object of this invention is to provide a PLL synthesizer relatively favorable in view of cost.

In order to attain the above-mentioned objects, this invention comprises a tuning means which tunes to the difference frequency of the mixer and leads the frequency to the programmable counter means; and a control means which detects a part of the frequency division ratio setting digital input data of the programmable counter means and controls the tuning frequency of the above tuning means in accordance with the detected signal; wherein only the output signal with a prescribed frequency of the mixer is selectively picked up and fed to the programmable counter.

According to this invention, since the tuning to the prescribed frequency is done at the output stage of the mixer and the tuned frequency is supplied without loss to the programmable counter, the operation frequency of the counter can be pulled up to the maximum operation frequency (15 MHz) of the counter. In another word, the counter is operable even if the difference frequency $f_1 - f_2$ of the mixer is 15 MHz. Furthermore, the programmable counter can obtain a stable and sufficiently large amplitude input at its operation frequency.

The convenience of this invention is that the control of the tuning frequency at the tuning means is automatically done.

Still another favor of this invention from a point of cost is that the circuit construction is simple.

DESCRIPTION OF THE PREFERRED EMBODIMENTS

Figure 2:
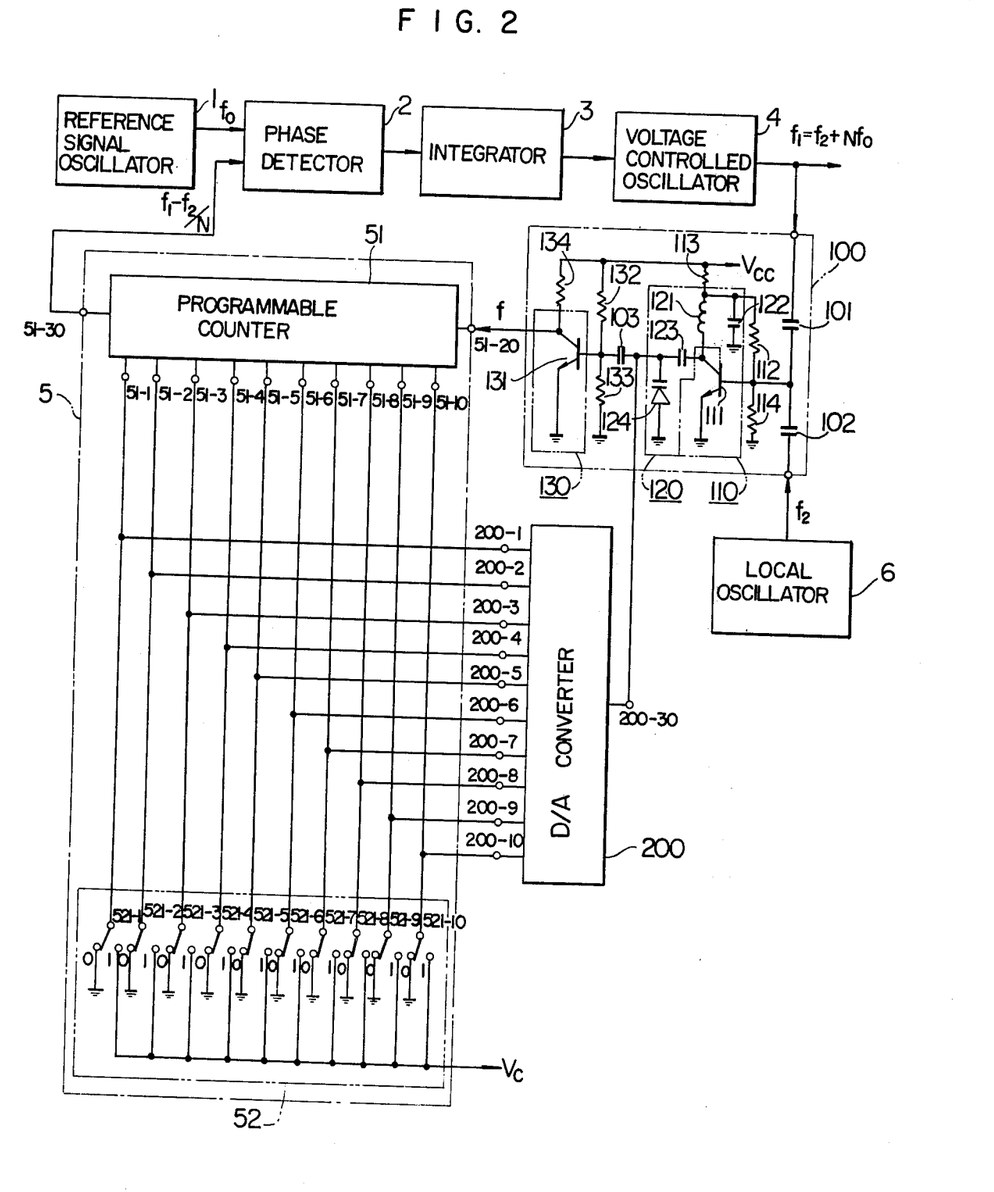
FIG. 2 is a block diagram of the connection of a PLL synthesizer according to one embodiment of this invention.

Explanation of the embodiments of this invention will be made hereinafter in conjunction with the drawings. FIG. 2 is a block diagram of a PLL synthesizer according to one embodiment of this invention. In FIG. 2, like reference numerals are used to denote like parts as used in FIG. 1. 100 denotes a frequency mixing and extracting means comprising a mixer 110 of a transistor 111 which mixes the outputs from the voltage controlled oscillator 4 and the local oscillator 6, a tuner which tunes to the difference frequency $f_1 - f_2$ of the output frequencies of the mixer 110, and an amplifier 130 of transistor 131 which amplifies the output having the tuned frequency and leads it to the programmable counter 51. The base of the mixing transistor 111 of the mixer 110 is connected to the output stage of the voltage controlled oscillator 4 through a coupling capacitor 101 and also connected to the output stage of the local oscillator 6 through a coupling capacitor 102. The base of the transistor 111 is further connected to a power supply +Vcc through the resistors 112 and 113 and to earth through the resistor 114. The emitter of the transistor 111 is connected directly to the earth. The collector is connected to the power supply +Vcc through an inductance element (coil) 121 of the tuning means 120 and the resistor 113, and further connected to earth through a capacitor 122. The collector of the transistor 111 is also connected through a capacitor 123 to the cathode of a reactance element or a variable capacitance diode 124 whose reactance varies with a d.c. applied voltage. The anode of the diode 124 is directly connected to earth. Further, the collector of the transistor 111 is connected to the base of the amplifying transistor 131 through capacitors 123 and 103. The base of the transistor 131 is connected to the power supply +Vcc through a resistor 132 and also connected to earth through a resistor 133. The emitter of the transistor 131 is directly connected to earth, further to the power supply +Vcc through a resistor 134 and to the input terminal 51-20 of the programmable counter 51. 200 denotes a digital-analog converter provided with the same number of input terminals (in this embodiment ten terminals) as that of the digital input data terminals of the counter 51, and one output terminal. The input terminals 200-1, 200-2, 200-3, . . . 200-10 are connected respectively to the input terminals 51-1, 51-2, 51-3 . . . 51-10 of the counter 51. Therefore, each input terminal of the converter 200 receives a part of the digital input data going from the frequency division ratio setting means 52 to the counter 51. The converter 200 converts its digital signal to an analog signal or a d.c. voltage and leads it to the output terminal 200-30. The output terminal 200-30 is connected to the cathode of the variable capacitance diode 124 in the tuning means 120. The d.c. voltage appearing at the terminal 200-30 is applied to the variable capacitance diode 124 as a reverse bias voltage and varies the reactance of the diode 124 in accordance with the value of the applied voltage. The tuned frequency of the tuning means 120 in this case is given by $$f = \frac{1}{2\pi \sqrt{L_{121} C}},$$

where $$C = \frac{C_{124} \cdot C_{123}}{C_{124} + C_{123}} = C_{124}$$

$$\therefore C_{124} >> C_{123}, C_{122},$$

and $L_{121}$ is the inductance of the inductance element 121, $C_{122}$ is the capacitance of the capacitor 122, $C_{123}$ is the capacitance of the capacitor 123, and $C_{124}$ is the capacitance of the variable capacitance diode.

Next, we will assume, in the circuit of FIG. 2, that the oscillation frequency $f_0$ of the reference signal oscillator 1, the oscillation frequency $f_1$ of the voltage controlled oscillator 4, and the oscillation frequency $f_2$ of the local oscillator 6 as $f_0 = 20$ KHz,
$f_1 = 125 - 135$ MHz,
$f_2 = 120$ MHz.

Table 1 shows an example with five digital input terminals 51-1, 51-2, 51-3, 51-4 and 51-5 of the counter 51.

Table 1

| Frequency (MHz) of the voltage controlled oscillator | Frequency division ratio (N) of programmable counter | Digital input data | | | | | Voltage applied to the variable capacitance diode (V) | Difference frequency ($f_1 - f_2$) of the mixer (MHz) | Tuning frequency f of the tuning means (MHz) |
|---|---|---|---|---|---|---|---|---|---|
| | | 51-5 | 51-4 | 51-3 | 51-2 | 51-1 | | | |
| 125.00–125.10 | 250–255 | 0 | 0 | 1 | 1 | 1 | 0.8 | 5.00–5.10 | 5.05 |
| 125.12–125.74 | 256–287 | 0 | 1 | 0 | 0 | 0 | 1.1 | 5.12–5.74 | 5.43 |
| 125.76–126.38 | 288–319 | 0 | 1 | 0 | 0 | 1 | 1.4 | 5.76–6.38 | 6.07 |
| 126.40–127.02 | 320–351 | 0 | 1 | 0 | 1 | 0 | 1.8 | 6.40–7.02 | 6.71 |
| 127.04–127.66 | 352–383 | 0 | 1 | 0 | 1 | 1 | 2.3 | 7.04–7.66 | 7.35 |
| 127.68–128.30 | 384–415 | 0 | 1 | 1 | 0 | 0 | 2.9 | 7.68–8.30 | 7.99 |
| 128.32–128.94 | 416–447 | 0 | 1 | 1 | 0 | 1 | 3.5 | 8.32–8.94 | 8.63 |
| 128.96–129.58 | 448–479 | 0 | 1 | 1 | 1 | 0 | 4.2 | 8.96–9.58 | 9.27 |
| 129.60–130.22 | 480–511 | 0 | 1 | 1 | 1 | 1 | 4.9 | 9.60–10.22 | 9.91 |
| 130.24–130.86 | 512–543 | 1 | 0 | 0 | 0 | 0 | 5.7 | 10.24–10.86 | 10.55 |
| 130.88–131.50 | 544–575 | 1 | 0 | 0 | 0 | 1 | 6.5 | 10.88–11.50 | 11.19 |
| 131.52–132.14 | 576–607 | 1 | 0 | 0 | 1 | 0 | 7.3 | 11.52–12.14 | 11.83 |
| 132.16–132.78 | 608–639 | 1 | 0 | 0 | 1 | 1 | 8.2 | 12.16–12.78 | 12.47 |

Table 1-continued

| Frequency (MHz) of the voltage controlled oscillator | Frequency division ratio (N) of programmable counter | Digital input data | | | | | Voltage applied to the variable capacitance diode (V) | Difference frequency $(f_1 - f_2)$ of the mixer (MHz) | Tuning frequency f of the tuning means (MHz) |
|---|---|---|---|---|---|---|---|---|---|
| | | 51-5 | 51-4 | 51-3 | 51-2 | 51-1 | | | |
| 132.80–133.42 | 640–671 | 1 | 0 | 1 | 0 | 0 | 9.3 | 12.80–13.42 | 13.11 |
| 133.44–134.06 | 672–703 | 1 | 0 | 1 | 0 | 1 | 10.6 | 13.44–14.06 | 13.75 |
| 134.08–134.70 | 704–735 | 1 | 0 | 1 | 1 | 0 | 11.9 | 14.08–14.70 | 14.39 |
| 134.72–135.00 | 736–750 | 1 | 0 | 1 | 1 | 1 | 13.4 | 14.72–15.00 | 14.86 |

Here, an up-counter of binary code is used as the programmable counter. The digital-analog converter supplies an output d.c. voltage in accordance with the tuning curve as shown in FIG. 3.

Figure 3:
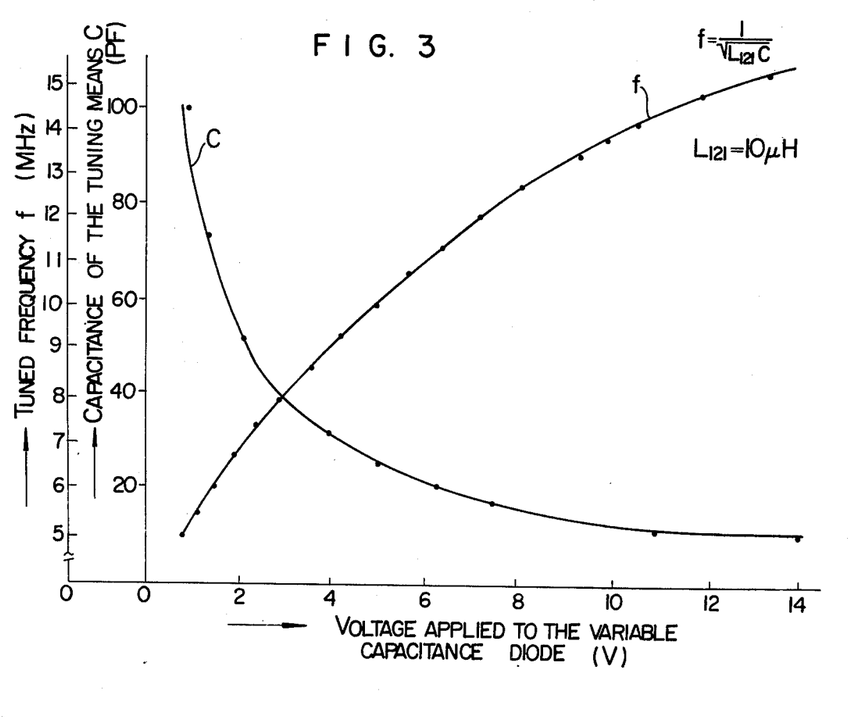
FIG. 3 is a characteristic curve for the explanation of the embodiment of FIG. 2.

FIG. 3 shows a characteristic curve showing the relation between the tuned frequency $f$ and the d.c. voltage applied to the variable capacitance diode, and the capacitance $c$ of the diode at the tuning.

As described above, by controlling in such a manner that a part of digital input data of the programmable counter means 5 is detected and then converted to an analog voltage in accordance with the level thereof and then the analog d.c. voltage is applied to the variable capacitance diode 124 in the tuning means 120 provided at the output stage of the mixer 110, with the capacitance being controlled so as to adjust the tuning frequency to the difference frequency of the mixer 110, the signal with the mixed difference frequency can have a stable and sufficiently large amplitude. Moreover, since the tuned frequency is controlled to be tuned at the difference frequency of the mixer 110 in accordance with the digital input data of the counter means 5, the difference frequency of the mixer 110 to the operation frequency of the counter can be pulled up to its maximum operation frequency.

Figure 4:
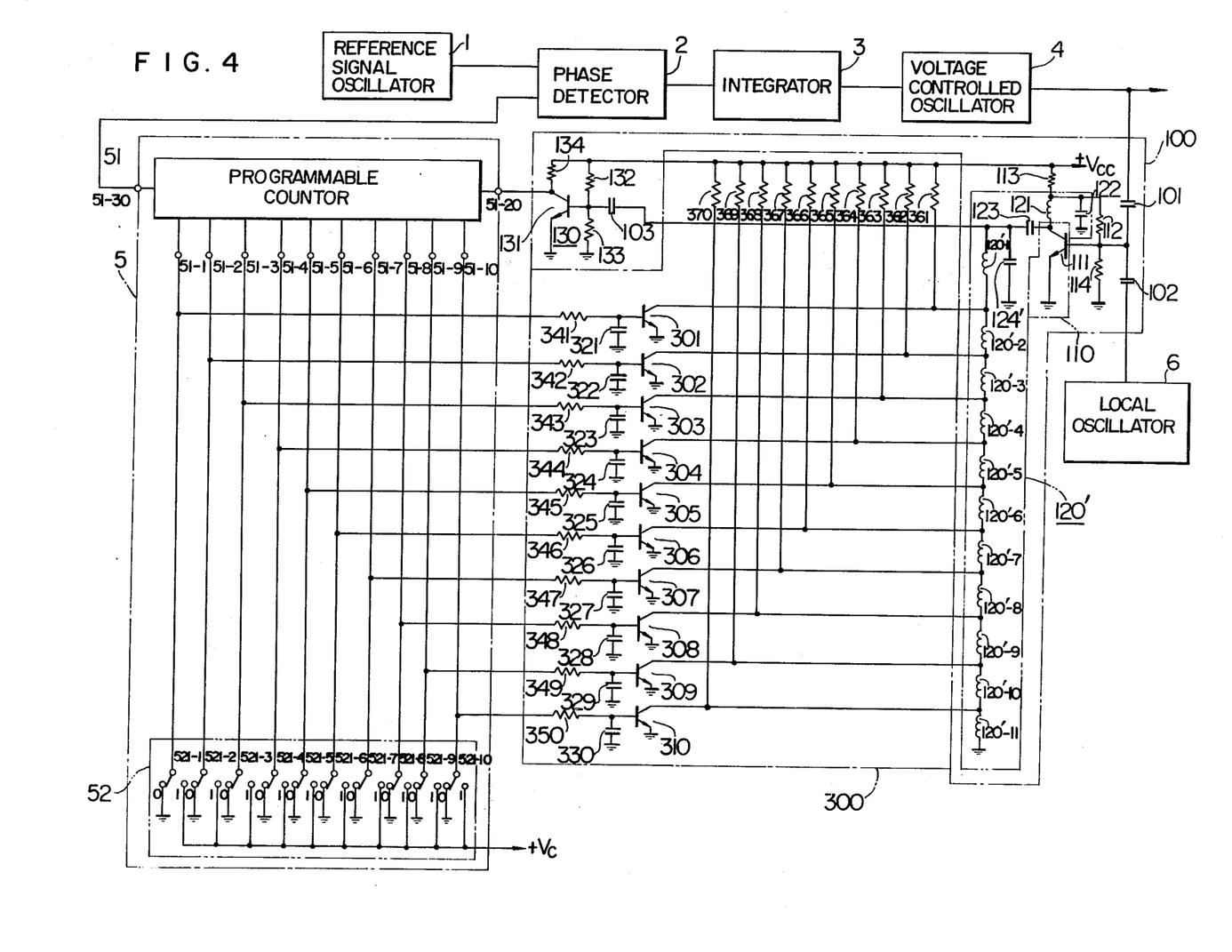
FIG. 4 is a block diagram showing a PLL synthesizer according to another embodiment of this invention.

FIG. 4 is a block diagram of a PLL synthesizer showing another embodiment of this invention. In FIG. 4, the like reference numerals are used to denote like parts as used in FIGS. 1 and 3. 120' denotes a tuning means. The collector of the mixing transistor 111 of the mixer 110 is connected to the earth through a capacitor 123 of the tuning means 120' and a capacitor 124' (with a capacitance $C_{124'}$), which serves as the variable capacitance diode 124 of FIG. 2, and also through a series circuit of the capacitance 123 and inductances 120'-1 (inductance $L_1$), 120'-2($L_2$) — 120'-11($L_{11}$). 300 denotes a switch group having a plurality of switching transistors 301, 302, . . . 310. The bases of these switching transistors 301 to 310 are connected to earth through capacitors 321 to 330 respectively, and also connected to the input data terminals 51-1 . . . 51-10 through resistors 341 to 350 respectively, and the connecting points between these input data terminals and the frequency division ratio setting switches 521-1 to 521-10 respectively. The emitters of the transistors 301 to 310 are directly connected to earth. The collectors are connected to the power supply +Vcc through resistors 361 to 370 respectively, and further connected to the earth sides of the inductors 120'-1 to 120'-10 respectively. These switching transistors are switched by stepwise inputs of the digital data from the frequency division setting means 52 and the counter 51.

In the circuit construction shown in FIG. 4, when a digital signal 1 is being supplied from the frequency division ratio setting means 52 to the data input terminal 51-1 of the counter 51, a part of the digital signal is also supplied to the base of the transistor 301 to make the transistor on. By this switching, the inductor 120'-1 works as an inductance element of the tuning means 120'. Since inductors 120'-2 to 120'-11 are short-circuited by the transistor 301, their effect as an inductance element is lost. Therefore, the tuned frequency $f$ of the tuning means 120' is given by $$f = \frac{1}{2\pi \sqrt{L_1 C_{124'}}}$$

where $L_1$ is the inductance of the inductor 120'-1 and $C_{124'}$ is the capacitance of the capacitor 124'.

In a similar way, if the switching transistor 301 is off and 302 is on, the inductances 120'-1 and 120'-2 work as the inductance element of the tuning means 120'. Since other inductors are short-circuited, their effect as an inductance is lost. Then, the tuned frequency $f$ of the tuning means 120' is given by $$f = \frac{1}{2\pi \sqrt{(L_1 + L_2) C_{124'}}}$$

where $L_2$ is the inductance of the inductor $L_2$. In a similar way, when the switching transistor 302 is off and 303 is on; and 302 is off and 304 is on etc. — the inductance of the tuning means 120' becomes $L_1 + L_2 + L_3 + L_4 +$ etc. — whereby the tuned frequency becomes $$f = \frac{1}{2\pi \sqrt{(L_1 + L_2 + L_3 + L_4 + ...) C_{124'}}}.$$

Each frequency thus obtained is set at each central frequency of the difference frequencies of the mixer 110.

As described above, by detecting the presence of the input to the digital input data terminals 51-1 to 51-10 of the counter 51, making on and off the switching transistors 301 to 310 in accordance with the presence and absence of the detected signals, switching the inductors 120'-1 to 120'-11 of the tuning means 120' provided at the output stage of the mixer in accordance with the on and off of the transistors and controlling the tuning frequency of the means 120' to be tuned at the difference frequency of the mixer, the same effect as that of the embodiment shown in FIG. 2 may be obtained economically.

Although in the embodiment of FIG. 4 the inductors are switched in series, it is apparent that they may be switched in parallel or replaced by capacitors. If the input data of the counter 51 are given by the connect and disconnect of a switch, the inductors of the tuning means 120' may be switched in gang therewith. Further, it may be possible to give a weight to the values of inductors or capacitors and vary their combination.

Figure 5:
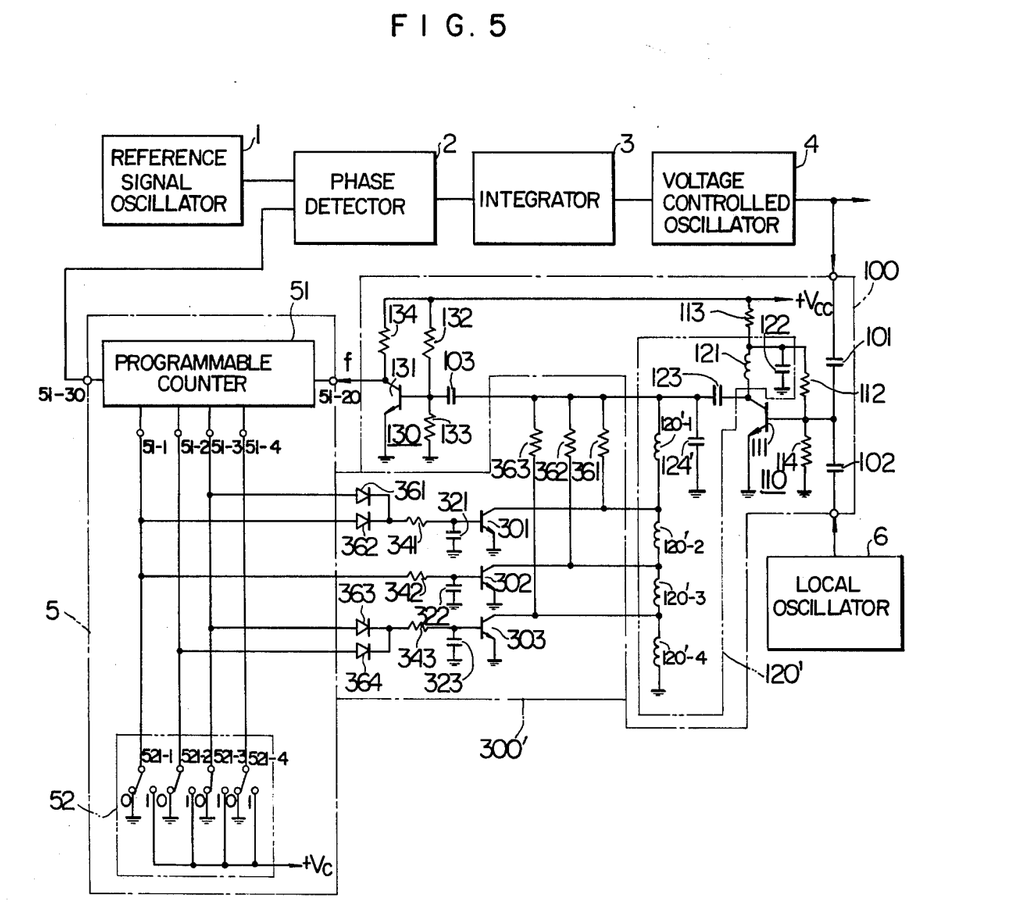
FIG. 5 is a block diagram showing an example of the application of FIG. 4.

FIG. 5 shows an example of the application of FIG. 4. In FIG. 5, the base of switching transistor 301 is connected to the cathodes of diodes 381 and 382 through a resistor 341. The anode of the diode 381 is connected to the input data terminal 51-3 of the counter 51 while the anode of the diode 382 is connected to the input data terminal 51-1 of the counter 51. The base of the transistor 302 is connected to the input data terminal 51-1 of the counter through a resistor 342, while the base of the transistor 303 is connected to the cathodes of diodes 383 and 384. The anode of the diode 383 is connected to the input data terminal 51-3 while the anode of the diode 384 is connected to the input data terminal 51-2 of the counter 51. Other parts are the same as those of FIG. 4, and like reference numerals are used to denote like parts as used in FIG. 4. No detailed explanation of these parts will be made.

In the circuit construction of FIG. 5, if the logical product of the inputs of terminals 51-1 and 51-2 of the counter 51 is 1, the transistor 301 is switched on and the inductance elements 120'-2 (inductance $L_2$), 120'-3 ($L_3$) and 120'-4 ($L_4$) are short-circuited. The tuned frequency of the tuning means 120' becomes $$f = \frac{1}{2\pi \sqrt{L_1 C_{124'}}}$$

If the input to the terminal 51-1 is 1 and the input to the terminal 51-2 is 0, the transistor 302 is switched on and the inductors 120'-3 ($L_3$) and 120'-4 ($L_4$) are short-circuited. The tuned frequency of the tuning means 120' becomes $$f = \frac{1}{2\pi \sqrt{(L_1 + L_2)C_{124'}}}$$

In a similar way, if the input to the terminal 51-1 is 0 and the logical product of the inputs to the terminals 51-2 and 51-3 is 1, the transistor 303 is switched on and the inductor 120'-4 ($L_4$) is short-circuited. The tuned frequency $f$ of the tuning means 120' becomes $$f = \frac{1}{2\pi \sqrt{(L_1 + L_2 + L_3)C_{124'}}}.$$

Table 2 shows an example of setting in the above case.

Table 2

| Oscillation frequency $f_1$ (MHz) of the voltage controlled oscillator | Frequency division ratio of programmable counter (N) | Digital input data | | | Difference frequency $f_1 - f_2$ (MHz) of the mixer | Tuned frequency of the tuning means f (MHz) | Inductance $L(\mu H)$ of the tuning means |
|---|---|---|---|---|---|---|---|
| | | 51-1 | 51-2 | 51-3 | | | |
| 125.00–125.10 | 250–255 | 0 | 0 | 1 | 5.00–5.10 | 6.33 | 63.2 |
| 125.12–127.60 | 256–383 | 0 | 1 | 0 | 5.12–7.66 | 6.33 | 63.2 |
| 127.68–130.22 | 384–511 | 0 | 1 | 1 | 7.68–10.22 | 8.91 | 31.9 |
| 130.24–132.78 | 512–639 | 1 | 0 | 0 | 10.24–12.78 | 11.51 | 19.1 |
| 132.80–135.00 | 646–750 | 1 | 0 | 1 | 12.80–15.00 | 13.90 | 13.1 |

The capacitance of the capacitor 124' is $C_{124'} = 10$ PF, and $L_1 = 13.1$, $L_2 = 6$, $L_3 = 12.8$, $L_4 = 31.3$ ($\mu F$). By the above setting, the same functional effect may be obtained as that of the above embodiment.

What is claimed is:

1. A PLL synthesizer comprising a reference signal oscillator; a programmable counter means; a phase detector which detects a phase difference between the output frequencies from said counter means and said signal oscillator and obtains a d.c. voltage in accordance with said phase difference; a voltage controlled oscillator whose oscillation frequency is controlled by the d.c. voltage from said phase detector; a local oscillator; a frequency mixing and extracting means including at least a mixer, which mixes the outputs of said local oscillator and said voltage controlled oscillator and a tuning means which tunes at a prescribed frequency of the outputs of said mixer and lead the output to said programmable counter means; and a control means which detects a part of frequency division ratio setting digital input data from said programmable counter means and controls the frequency of said tuning means to be tuned to the mixed difference frequency of said mixer in accordance with the detected signal.

2. A PLL synthesizer according to claim 1, wherein said control means comprises a digital-analog converter which detects a part of said frequency division setting digital input data from said programmable counter means and converts the detected digital signal to an analog d.c. voltage, and a means for applying said d.c. voltage of said digital-analog converter to a reactance element of said tuning means thereby varying its reactance.

3. A PLL synthesizer according to claim 1, wherein said control means comprises a switching means for detecting the presence or absence of frequency division ratio setting digital input data from said programmable counter means and switching in accordance with the presence or absence of said data, and a means for varying the inductance of said inductor of said tuning means by the switching action of said switching means.

4. A PLL synthesizer according to claim 1, wherein said tuning means comprises an inductance element, and a reactance element whose reactance varies with a d.c. voltage.

5. A PLL synthesizer according to claim 2, wherein said digital-analog converter comprises the same number of input terminals as that of the digital input data terminals of said programmable counter means and one output terminal, and is constructed in such a manner that the digital input signals supplied to said data input terminals are converted to analog d.c. voltage signals in accordance with their input levels.

6. A PLL synthesizer according to claim 3, wherein said switching means comprises a plurality of switching transistors working as switching elements and first and second bias resistors, the input electrode of said switching transistor being connected to said programmable counter means through said first resistor while the output electrode of said switching transistor being connected to a power source through said second resistor and to one end of said inductance element of said tuning means.

7. A PLL synthesizer according to claim 4, wherein said reactance element comprises a variable capacitance diode.

8. A PLL synthesizer comprising a reference signal oscillator; a programmable counter means; a phase detector which detects a phase difference between the output frequencies from said counter means and said signal oscillator and obtains a d.c. voltage in accordance with said phase difference; a voltage controlled oscillator whose oscillation frequency is controlled by the d.c. voltage from said phase detector; a local oscillator; a mixer which mixes the output frequencies of said local oscillator and said voltage controlled oscillator; a tuning means having a tuning coil and a variable capacitance diode for tuning to the difference frequency of the output of said mixer, an amplifier for amplifying the output having said tuned frequency and leading it to said programmable counter means; a digital-analog converter which detects a part of the frequency division ratio setting digital input data from said programmable counter means and converts it to an analog d.c. voltage signal in accordance with the level of said detected d.c. voltage signal; and a means for controlling the capacitance of said variable capacitance diode to tune the frequency of said tuning means to the mixed difference frequency of said mixer.

9. A PLL synthesizer comprising a reference signal oscillator; a programmable counter means; a phase detector which detects a phase difference between the output frequencies from said counter means and said signal oscillator and obtains a d.c. voltage in accordance with said phase difference; a voltage controlled oscillator whose oscillation frequency is controlled by the d.c. voltage from said phase detector; a local oscillator; a mixer which mixes the output frequencies of said local oscillator and said voltage controlled oscillator; a tuning means having a plurality of tuning coils and a tuning capacitor for tuning to a prescribed frequency of the output of said mixer, an amplifier for amplifying the tuned frequency output of said tuning means and leading it to said programmable counter means; and a plurality of switching transistors for detecting the presence or absence of the frequency division ratio setting digital input data from said programmable counter means, switching on or off in accordance with the presence or absence of said data to shortcircuit selectively said tuning coils, and controlling to tune the frequency of said tuning means in said frequency mixing and extracting means to the mixed difference frequency of said mixer in accordance with said frequency division setting digial input data.

10. In a PLL synthesizer comprising a voltage controlled oscillator for generating an output having a prescribed frequency in accordance with a value of an applied controlled voltage; a local oscillator which generates an output having a frequency to be mixed with the frequency of the output of said voltage controlled oscillator; a mixer which mixes the outputs of said both oscillators; a means for receiving the outputs of said mixer and extracting therefrom a component having a difference frequency between the frequencies of said both oscillators; a programmable counter means for frequency dividing the output of said frequency extracting means in accordance with a prescribed program; a reference signal oscillator whose output is compared with the output having its frequency divided by said counter means, a phase detector which detects, a phase difference between the outputs of said reference signal oscillator and said counter means, generates a d.c. voltage corresponding to the phase difference and applies it to said voltage controlled oscillator as a control signal; an improvement wherein said programmable counter means sets the frequency division ratio by the application of a plurality of digital inputs, and said frequency extracting means comprises a resonance circuit of inductors and capacitors and a means for controlling said resonance circuit by varying at least inductances of said inductors and capacitances of said capacitors in accordance with said digital inputs, and varies a resonance frequency of said resonance circuit in accordance with a change of frequency division ratio setting by said programmable counter means thereby to tune the resonance frequency to the difference frequency of the output of said mixer.

11. An improvement according to claim 10, wherein said resonance circuit is composed of a series resonance circuit of inductance elements having a fixed inductance and a variable capacitance diode, and said means for controlling said resonance circuit comprises a means for generating a d.c. control voltage in accordance with digital inputs and a means for applying said d.c. control voltage to said variable capacitance diode as a reverse bias.

12. An improvement according to claim 10, wherein said resonance circuit is composed of a parallel resonance circuit of a capacitor element having a fixed capacitance and a plurality of inductance elements having a fixed inductance, and said means for controlling said resonance circuit comprises switching elements for connecting earth side terminals of said inductance elements directly to ground and means for controlling on or off said switching elements in accordance with the presence of absence of said digital inputs.

* * * * *

UNITED STATES PATENT AND TRADEMARK OFFICE
CERTIFICATE OF CORRECTION

PATENT NO. : 4,048,582

DATED : September 13, 1977

INVENTOR(S) : Takashi Ihara

It is certified that error appears in the above-identified patent and that said Letters Patent are hereby corrected as shown below:

Column 4, in the formula for C between lines 30 and 35, the portion "= $C_{124}$" should be deleted; in the formula for $C_{124} >> C_{123}$, $C_{122}$, the portion ", $C_{122}$" should be deleted; and on line 36, delete "$C_{122}$ is the capacitance of the capacitor 122,".

Column 7, line 5, change "cathodes" to --anodes--; line 6, change "anode" to --cathode--; line 8, change "anode" to --cathode--; line 12, change "cathodes" to --anodes--; line 13, change "anode" to --cathode--; line 14, change "anode" to --cathode--; line 16, after "counter 51", insert the new sentence: --Reference numerals 391 and 392 denote base bias resistors of the transistors 301 and 303, respectively.--; line 21, change "51-2" to --51-3--; line 32, change "51-2" to --51-3--; line 63, change "$\mu F$" to --$\mu H$--.

In Table 2, line 3 of the data, change "127.68" to --127.62--

Column 10, line 51, after "off", insert --of--; line 52, change "of" (first occurrence) to --or--.

UNITED STATES PATENT AND TRADEMARK OFFICE
CERTIFICATE OF CORRECTION

PATENT NO. : 4,048,582
DATED : September 13, 1977
INVENTOR(S) : Takashi Ihara

It is certified that error appears in the above-identified patent and that said Letters Patent are hereby corrected as shown below:

Figure 5 should be amended to change the direction of diodes 381 to 384, add bias resistors 391 and 392, connect resistors 361 to 363 to the $V_{cc}$ line rather than the base of 131, and change the lines of the tuner 120' so that the capacitors 122 and 123 and the inductor 121 are not included in the tuner 120', as shown below:

UNITED STATES PATENT AND TRADEMARK OFFICE
CERTIFICATE OF CORRECTION

PATENT NO. : 4,048,582
DATED : September 13, 1977
INVENTOR(S) : Takashi Ihara

It is certified that error appears in the above-identified patent and that said Letters Patent are hereby corrected as shown below:

In the drawings, Fig. 2 should include a resistor on the line between the capacitor 103 and the D/A converter 200, and the shadow lines for the tuner 120 should be changed so that the capacitor 122 is not included within the tuner 120. Fig. 4, the shadow lines for the tuner 120 should be changed so that the capacitor 123, the inductor 121, and capacitor 122 are not included within the tuner 120.

Signed and Sealed this

Sixteenth Day of October 1979

[SEAL]

Attest:

RUTH C. MASON
Attesting Officer

LUTRELLE F. PARKER
Acting Commissioner of Patents and Trademarks